United States Patent [19]
Traynor

[11] Patent Number: 6,008,659
[45] Date of Patent: *Dec. 28, 1999

[54] METHOD OF MEASURING RETENTION PERFORMANCE AND IMPRINT DEGRADATION OF FERROELECTRIC FILMS

[75] Inventor: Steven Traynor, Colorado Springs, Colo.

[73] Assignee: Ramtron International Corporation, Colorado Springs, Colo.

[ * ] Notice: This patent issued on a continued prosecution application filed under 37 CFR 1.53(d), and is subject to the twenty year patent term provisions of 35 U.S.C. 154(a)(2).

[21] Appl. No.: 08/616,913

[22] Filed: Mar. 15, 1996

[51] Int. Cl.⁶ .................................... G11C 11/22
[52] U.S. Cl. ........................ 324/658; 365/201; 365/145
[58] Field of Search .................. 365/201, 145, 365/210; 324/211, 658

[56] References Cited

U.S. PATENT DOCUMENTS

| | | | |
|---|---|---|---|
| 3,492,662 | 1/1970 | Whitson | 324/211 |
| 5,254,482 | 10/1993 | Fisch | 365/201 |
| 5,661,730 | 8/1997 | Mitra | 365/201 |
| 5,751,628 | 5/1998 | Hirano | 365/201 |

FOREIGN PATENT DOCUMENTS

| | | | |
|---|---|---|---|
| 1089475 | 9/1960 | Germany | 324/211 |
| 0731406 | 4/1980 | U.S.S.R. | 324/211 |
| 0917149 | 3/1982 | U.S.S.R. | 324/211 |

OTHER PUBLICATIONS

*Piezoelectric Ceramics*, by Jaffe, Cook, and Jaffe, pp. 37–38, published by the Academic Press © 1971.

*Primary Examiner*—Josie Ballato
*Assistant Examiner*—Jose M. Solis
*Attorney, Agent, or Firm*—Peter J. Meza; Michael R. Casey; William J. Kubida

[57] ABSTRACT

A test method for characterizing retention performance, both same state and opposite state performance, of ferroelectric capacitors includes the steps of writing an original complementary data state into first and second ferroelectric capacitors after the ferroelectric capacitors have been initialized into an initial valid data state. The first and second ferroelectric capacitors are then subjected to time and temperature stress. The original complementary data state from the first and second ferroelectric capacitors is then read, and same state charge ($Q_{SS}$) information is collected. An opposite complementary data state is then written in the first and second capacitors. After a short time interval, possibly at an elevated temperature, the opposite complementary data state from the first and second ferroelectric capacitors is read to gather opposite state charge ($Q_{OS}$) information. The original complementary data state is then written into the first and second ferroelectric capacitors. The first and second ferroelectric capacitors are then subjected to further stress cycles, after which the same state and opposite state charge values are recorded. A plot of the same state charge ($Q_{SS}$) and opposite state charge ($Q_{OS}$) versus log time can be generated, which has great value for fully characterizing a ferroelectric capacitor and for predicting the performance of a ferroelectric capacitor in a memory circuit.

20 Claims, 8 Drawing Sheets

METHOD OF MEASURING RETENTION PERFORMANCE AND IMPRINT DEGRADATION OF FERROELECTRIC FILMS

This application is related to copending application Ser. No. 08/616,856 filed on the same date as this application entitled "The Use of Calcium and Strontium Dopants to Improve Retention Performance in a PZT Ferroelectric Film", which is incorporated herein by this reference.

BACKGROUND OF THE INVENTION

This invention relates generally to ferroelectric films and ferroelectric capacitors. More particularly, the present invention relates to a measurement method for characterizing the retention performance and imprint degradation of the ferroelectric film, as well as other performance aspects.

Ferroelectric thin films are a class of polar dielectric materials whose spontaneous polarization can be reversed with the application of an externally applied electric field. Because the polarization is spontaneous, the dipoles remain in the poled state upon removal of the electric field. The ability of a ferroelectric thin film to retain a poled state indefinitely forms the basis for its implementation as a nonvolatile memory cell element. The reversal of spontaneous polarization in a ferroelectric thin film is termed "switching." The phenomenon of ferroelectricity derives its name from ferromagnetics in that both possess domains, exhibit hysteresis under applied fields, and show Curie-Wiess behavior near the phase transition.

To quantify switching, measurements are carried out with the Sawyer-Tower test configuration 10 shown in FIG. 1. The Sawyer-Tower test configuration 10 includes a pulse generator 12, which can generate both positive-going and negative-going voltage pulses; a ferroelectric capacitor 14 desired to be characterized, designated $C_{FE}$; a standard "linear" load capacitor 16 designated $C_L$; and a digital oscilloscope 18. Inputs 20 and 22 of digital oscilloscope 18 are coupled across ferroelectric capacitor 14. It is desirable that the ratio of the values of the $C_L$ load capacitor 16 to the $C_{FE}$ ferroelectric capacitor 14 be greater than ten so that most of the input pulse voltage is dropped across load capacitor 16.

A pulse sequence 24 shown in FIG. 2A is applied to one of the terminals of ferroelectric capacitor 14. Pulse sequence 24 includes an initial pulse 26, followed by four pulses 28, 30, 32, and 34, which are used to characterize the electrical performance of ferroelectric capacitor 14. The initial pulse 26 is used to set the polarization state of ferroelectric capacitor 14. The charge associated with the leading edge of pulse 26 is termed "N" and the charge associated with the trailing edge of pulse 26 is termed "$N_A$", read "N after." If ferroelectric capacitor 14 is in a virgin state, however, the charge associated with the leading edge of pulse 26 is indeterminate. Thereafter, pulses 28–34 are used to traverse the full "hysteresis loop" 36 associated with ferroelectric capacitor 14. Note that while the hysteresis loop 36 can be traversed with two pulses, four pulses are required to acquire all four "P", "U", "N", and "D" charge components. These four charge components are explained in further detail below. The hysteresis loop 36 is used to characterize the electrical performance of ferroelectric capacitor, and is shown in FIG. 3.

Returning to FIG. 2A, a first positive-going pulse 28 is applied to ferroelectric capacitor 14. The charge associated with the leading edge of pulse 28 is termed "P" and the charge associated with the trailing edge of pulse 28 is termed "$P_A$", read "P after." A second positive-going pulse 30 is then applied to ferroelectric capacitor 14. The charge associated with the leading edge of pulse 30 is termed "U" and the charge associated with the trailing edge of pulse 30 is termed "$U_A$", read "U after." A first negative-going pulse 32 is then applied to ferroelectric capacitor 14. The charge associated with the leading edge of pulse 32 is termed "N" and the charge associated with the trailing edge of pulse 32 is termed "$N_A$", read "N after." A second negative-going pulse 34 is then applied to ferroelectric capacitor 14. The charge associated with the leading edge of pulse 34 is termed "D" and the charge associated with the trailing edge of pulse 34 is termed "$D_A$", read "D after." The sequence of four pulse 28, 30, 32, and 34 are used to completely traverse the hysteresis loop associated with ferroelectric capacitor 14, and are often referred to simply as the P (for positive), U (for up), N (for negative), and D (for down) pulses, respectively, or simply as the "PUND" waveform. Correspondingly, a P pulse is a switching pulse in the positive direction, a U pulse is a non-switched pulse in the positive direction, an N pulse is a switching pulse in the negative direction, and a D pulse is a non-switched pulse in the negative direction.

An actual oscilloscope waveform is shown in FIG. 2B, in which the P, $P_A$, U, $U_A$, N, $N_A$, D, and $D_A$ charge components are shown for a PZT (lead zirconate titanate) ferroelectric capacitor.

It is important to note that the peak voltage of the pulse sequence 24 shown in FIG. 2A is ideally two to three times the "coercive voltage" associated with the ferroelectric film under test. The "coercive voltage" is shown as points 38 (negative coercive voltage $-V_C$) and 40 (positive coercive voltage $+V_C$) along the x-axis or voltage axis of the hysteresis loop 36 plotted in FIG. 3. Points 42 and 44 on hysteresis loop 36 define the two stable states of the ferroelectric film after an externally applied electric field has been removed. Point 42 is generally referred to as an "up" polarization state, and point 44 is generally referred to as a "down" polarization state. These two points 42 and 44 can be arbitrarily defined as a logic one and a logic zero in a one-transistor, one-capacitor ("1T-1C") ferroelectric memory cell, and are compared against a reference level. In a two-transistor, two-capacitor ("2T-2C") ferroelectric memory cell (best seen in FIG. 7), the cell is self-referencing. In this case, the two capacitors are always set in a complementary data state, which means that one capacitor is at point 42 and the other is at point 44. To read the memory, the two capacitors are compared to one another to determine which capacitor is polarized up and which capacitor is polarized down. For example, in reference to the capacitors of FIG. 7, a logic one could be defined as capacitor 126 polarized up and capacitor 128 polarized down, in which case a logic zero would be defined as capacitor 126 polarized down and capacitor 128 polarized up.

The relationship of the individual pulses in the "PUND" characterization waveform and the ferroelectric hysteresis loop is shown in FIGS. 4A–4D and FIGS. 4E–4H. (Note that the "relaxation" property of ferroelectric films, in which a partial dimunition of the polarization magnitudes occurs after the applied external field is removed, is not shown in these figures.) FIGS. 4A–4D are four hysteresis loops showing a partial loop traversal (charge vs. applied voltage) corresponding to the individual pulses identified in the pulse sequences of FIGS. 4E–4H. In the hysteresis loop 50 of FIG. 4A, the ferroelectric capacitor is initially in a down polarization state. Upon the application of a positive-going P pulse 58 shown in FIG. 4E, the loop is traversed as shown, and the polarization state is switched to an up polarization state. The P and $P_A$ charge components are respectively associated with the leading and trailing edges of the P pulse 58 shown in FIG. 4E. In the hysteresis loop 52 of FIG. 4B, the ferroelectric capacitor is in an up polarization state. Upon the application of a positive-going U pulse 60 shown in FIG. 4F, the loop is traversed as shown, but the polarization state remains in the up polarization state. The U and $U_A$ charge components (which are "linear" charge components) are respectively associated with the leading and trailing edges of the U pulse 60 shown in FIG. 4F. In the hysteresis loop 54 of FIG. 4C, the ferroelectric capacitor is in an up polarization state. Upon the application of a negative-going N pulse 62 shown in FIG. 4G, the loop is traversed as shown, and the polarization state is switched to a down polarization state. The N and $N_A$ charge components are respectively associated with the leading and trailing edges of the N pulse 62 shown in FIG. 4G. In the hysteresis loop 56 of FIG. 4D, the ferroelectric capacitor is in a down polarization state. Upon the application of a negative-going D pulse 64 shown in FIG. 4H, the loop is traversed as shown, but the polarization state remains in the down polarization state. The D and $D_A$ charge components are respectively associated with the leading and trailing edges of the D pulse 64 shown in FIG. 4H.

The N and P pulses produce charge components that have linear and non-linear "switched" components, while the D and U pulses produce charge components that have only the linear or "non-switched" components.

A crucial property of nonvolatile semiconductor memories, and ferroelectric memories in particular is retention in the absence of power. Retention is the ability to maintain a given data state between the time the data state is written and when it is subsequently read. A certain data state is written into a ferroelectric capacitor, or, in the case of a two-transistor, two-capacitor ("2T-2C") memory cell, a complementary data state. After a specified period of time, and at temperature, if desired, the data state is read to determine whether or not the original data state has been retained in the memory cell. Retention can be further characterized into an ability to maintain the same state (same state="SS") data or charge ($Q_{SS}$) and an ability to read the opposite state data (opposite state="OS") or charge ($Q_{OS}$) after maintaining an original data state for an extended period of time. Failure to maintain the same data state rarely occurs, and failures are usually related to operation at elevated temperatures near the Curie point in which the ferroelectric material tends to become paraelectric. A small $Q_{OS}$ charge indicates the failure of a ferroelectric memory cell to read an opposite data state. This failure mechanism is known as "imprint", and is frequently the source of failure in a ferroelectric memory. Imprint is the inability to maintain an opposite data state once an initial data state has been stored under time and temperature stress, i.e. the original data state is preferred or has been "imprinted" into the ferroelectric capacitor or film.

Prior art techniques for testing retention in a ferroelectric film or capacitor included observing the ferroelectric material after a time and temperature interval for the presence of a hysteresis loop, single pulse testing, exclusively concentrating on the same state aspect of retention, one capacitor tests, and other tests that generally did not emulate the functionality of a ferroelectric capacitor in an actual memory circuit. Further, these tests did not generate graphical predictions for charge loss over time.

What is desired is a testing technique that can fully characterize the time and temperature dependence of retention performance, and in particular the resistance to the imprint failure mechanism, so that the electrical performance of a ferroelectric memory can be predicted.

SUMMARY OF THE INVENTION

It is, therefore, a principal object of the present invention to fully characterize the time and temperature dependence of same state and opposite state retention performance of a ferroelectric capacitor or thin film.

It is another object of the present invention to fully characterize a ferroelectric capacitor or film for imprint degradation so that memory circuit performance can be predicted.

It is another object of the invention to characterize other performance indicia, such as hysteresis loop shift or asymmetry, of a ferroelectric capacitor.

It is another object of the invention to characterize a ferroelectric capacitor for imprint degradation and hysteresis loop shift or asymmetry under conditions that simulate the performance of a 2T/2C ferroelectric memory cell.

It is another object of the invention to characterize the charge level associated with a reference for a 1T/1C ferroelectric memory cell.

It is an advantage of the invention that same state and opposite state performance can be characterized sequentially within the same test pattern.

According to the present invention a test method for characterizing retention performance, both same state and opposite state performance, of ferroelectric capacitors includes the steps of writing an original complementary data state into first and second ferroelectric capacitors after the ferroelectric capacitors have been initialized into an initial valid data state. The first and second ferroelectric capacitors are then subjected to time and temperature stress. The original complementary data state from the first and second ferroelectric capacitors is then read, and same state charge ($Q_{SS}$) information is collected. An opposite complementary data state is then written in the first and second capacitors. After a short time interval, possibly at an elevated temperature, the opposite complementary data state from the first and second ferroelectric capacitors is read to gather opposite state charge ($Q_{OS}$) information. The original complementary data state is then written into the first and second ferroelectric capacitors. The first and second ferroelectric capacitors are then subjected to further stress cycles, after which the same state and opposite state charge values are recorded. A plot of the same state charge ($Q_{SS}$) and opposite state charge ($Q_{OS}$) versus log time can be generated, which has great value for fully characterizing a ferroelectric capacitor and for predicting the performance of a ferroelectric capacitor in a memory circuit.

The test method for characterizing retention in ferroelectric capacitors simulates the behavior of a 2T/2C ferroelectric memory cell. The reading and writing of the ferroelectric capacitors is conducted in a two pulse sequence, which is similar to that of the operation of a 2T/2C ferroelectric memory cell. Since a ferroelectric memory cell as described herein has a destructive read mechanism, a read must be conducted as a read/restore two-pulse sequence, and a write must be conducted as a read/write two-pulse sequence. The test method incorporates the two-pulse sequence throughout.

If desired, the test method of the present invention can be slightly modified to indicate the possible presence of loop shift or loop asymmetry.

In addition, the test method of the present invention is easily adapted to provide information useful in setting the optimum reference charge level for a 1T/1C ferroelectric memory cell.

The foregoing and other objects, features and advantages of the invention will become more readily apparent from the following detailed description of a preferred embodiment of the invention which proceeds with reference to the accompanying drawings.

DETAILED DESCRIPTION

A method for characterizing same state and opposite state retention performance over time in ferroelectric capacitors includes the step of initializing first and second ferroelectric capacitors into a valid data state. Any valid data state will suffice. In the preferred embodiment, both capacitors are intialized with the same pulse sequence. Once the first and second ferroelectric capacitors are initialized, an original pair of complementary data states are written into the first and second ferroelectric capacitors.

Figure 5:
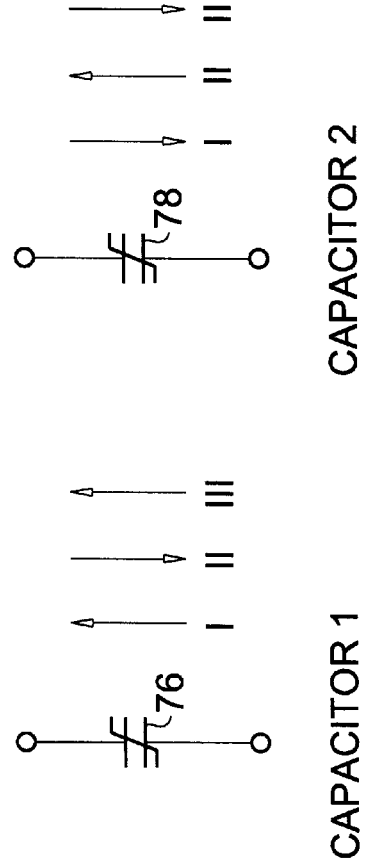
FIG. 5 shows two ferroelectric capacitors that are used as the devices under test in the test method of the present invention having three complementary data states (I, II, and III) in which one of the capacitors is polarized in an up data state and the other capacitor is polarized in a down data state.

Referring now to FIG. 5, the first ferroelectric capacitor 76 can be written to an "up polarization state" and the second capacitor 78 can be written to a "down polarization state" to create the original complementary data state. The original complementary data state is referred to in FIG. 5 as data state (I), in which the up arrow refers to the up polarization state in capacitor 76 and the down arrow refers to the down polarization state in capacitor 78.

After the original complementary data state (I) is written into capacitors 76 and 78, the capacitors are subjected to time and temperature stress. The amount of time and temperature stress is ideally matched to the performance of the capacitors. If the capacitors have extremely poor imprint performance, a short time duration and small or no temperature elevation should be used. If the capacitors have high resistance to imprint, a longer time duration and higher temperature elevation can be used. In the preferred embodiment, the time duration is initially about one hour increasing to an additional three hour bake, and a final sixteen hour bake, for a cumulative bake time of twenty hours. The bake temperature is about 150° C. After the ferroelectric capacitors are stressed, the original complementary data state (I) is read, same state retention charge is recorded, and and an opposite complementary data state (II) is written into the first and second ferroelectric capacitors 76 and 78. The polarization states for complementary data state (II) are indicated with corresponding arrows in FIG. 5. After capacitors 76 and 78 have been written to the new data state (II) a short time interval such as thirty seconds is allowed so that the imprint behavior can manifest. Longer time intervals can be used such as five minutes, or even longer if desired. Further, the time interval can elapse under an elevated temperature. After the delay, the opposite complementary data state (II) is read from the first and second ferroelectric capacitors 76 and 78 and the opposite state retention charge is recorded. A new complementary data state (III) that is identical to the original complementary data state (I) is written back into the first and second ferroelectric capacitors 76 and 78.

In order to fully characterize retention performance, the same state ($Q_{SS}$) and opposite state ($Q_{OS}$) charge values are collected with subsequent testing cycles over time and temperature. The steps of time and temperature stressing of the ferroelectric capacitors in an original complementary data state (I), gathering the same state charge value, the writing and reading of an opposite complementary data state (II) after a short delay to gather the opposite state charge value, are continually repeated to create a plot of these charge values as a function of time and temperature.

Figure 1:
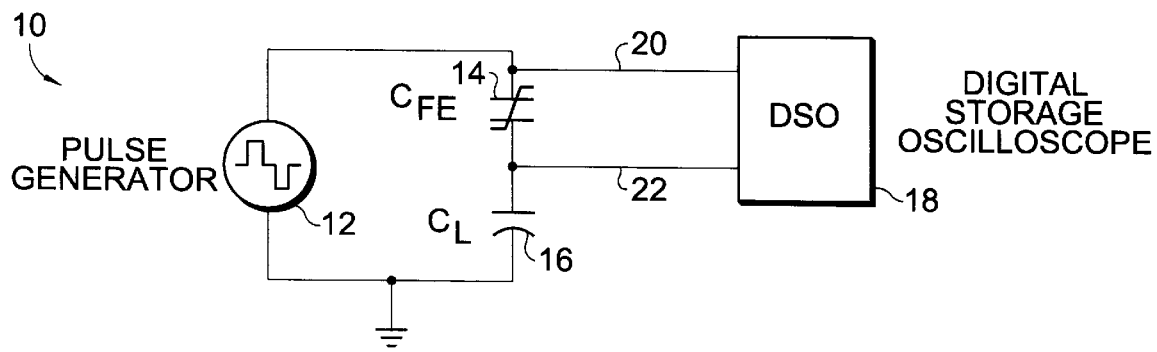
FIG. 1 is a "Sawyer-Tower" test configuration for obtaining the electrical performance of a ferroelectric capacitor.
Figure 2A:
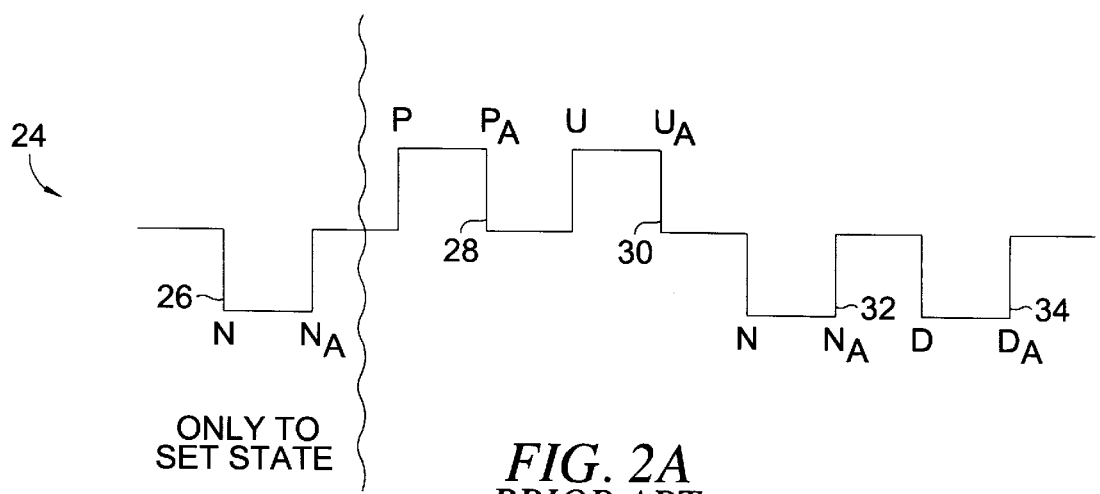
FIG. 2A is a five-pulse NPUND sequence used to set an initial state in a ferroelectric capacitor and to traverse the hysteresis loop.
Figure 3:
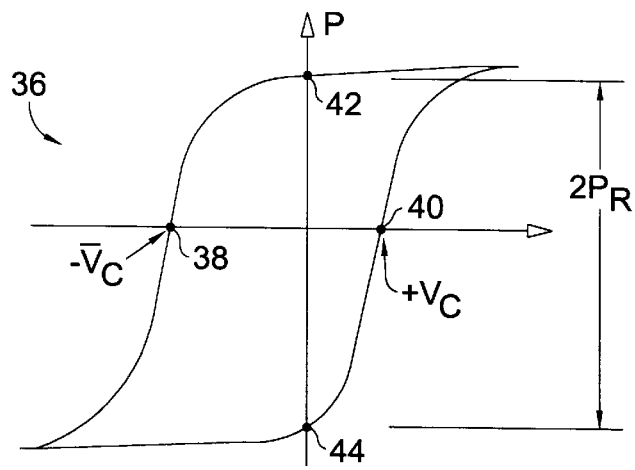
FIG. 3 is the hysteresis loop characteristic of a ferroelectric film or capacitor.
Figure 2B:
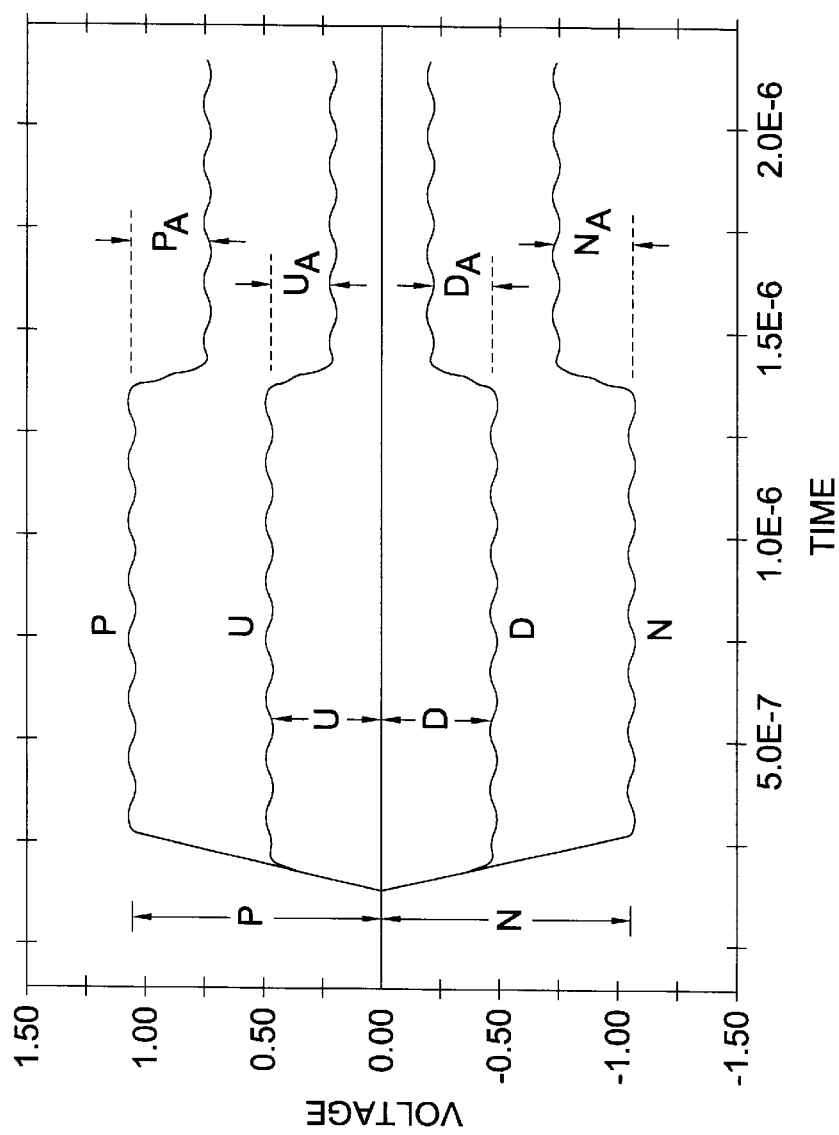
FIG. 2B is an actual oscilloscope waveform showing the P, $P_A$, U, $U_A$, N, $N_A$, D, and $D_A$ charge components for a PZT (lead zirconate titanate) ferroelectric capacitor.
Figure 4A:
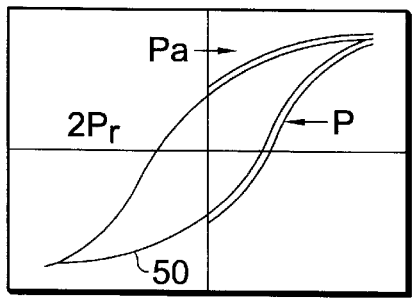
FIGS. 4A–4D and FIGS. 4E–4H illustrate the relationship of the individual pulses in the "PUND" characterization waveform and the ferroelectric hysteresis loop.
Figure 4E:
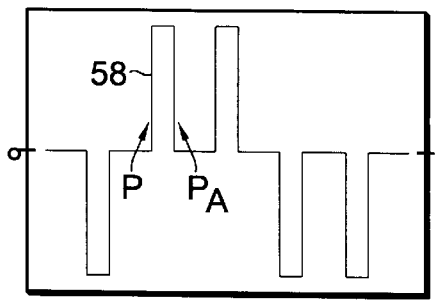
Figure 4B:
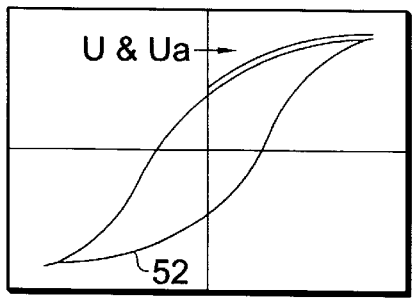
Figure 4F:
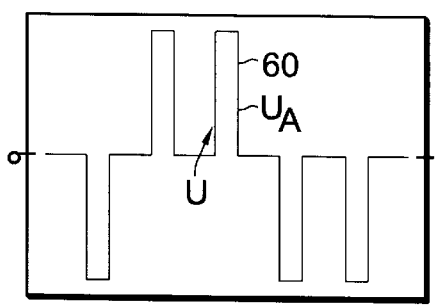
Figure 4C:
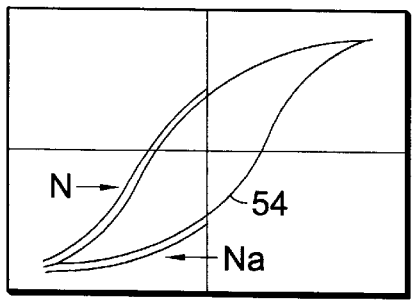
Figure 4G:
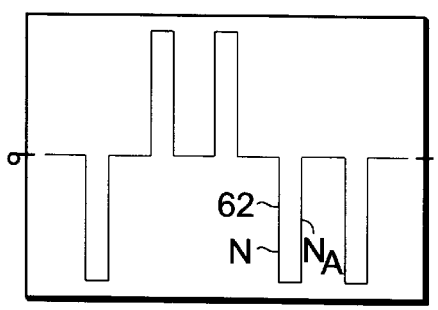
Figure 4D:
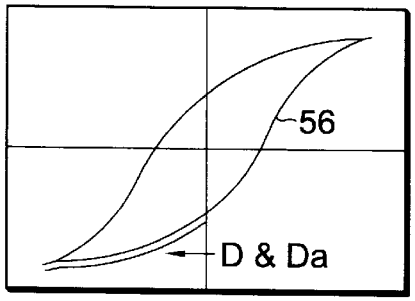
Figure 4H:
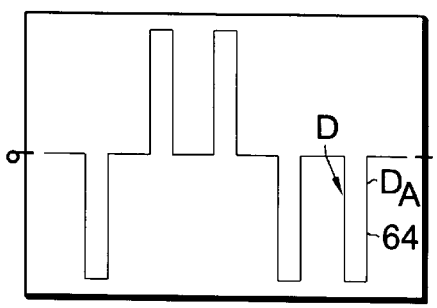
Figure 7:
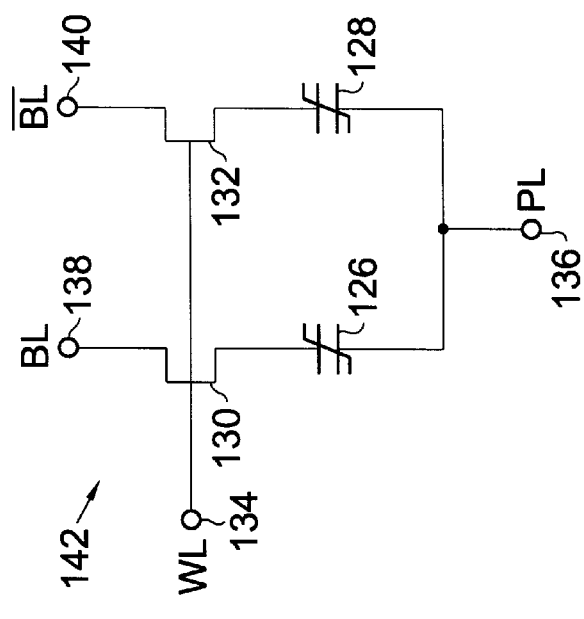
FIG. 7 is a circuit diagram of a 2T-2C ferroelectric memory cell.
Figure 6:
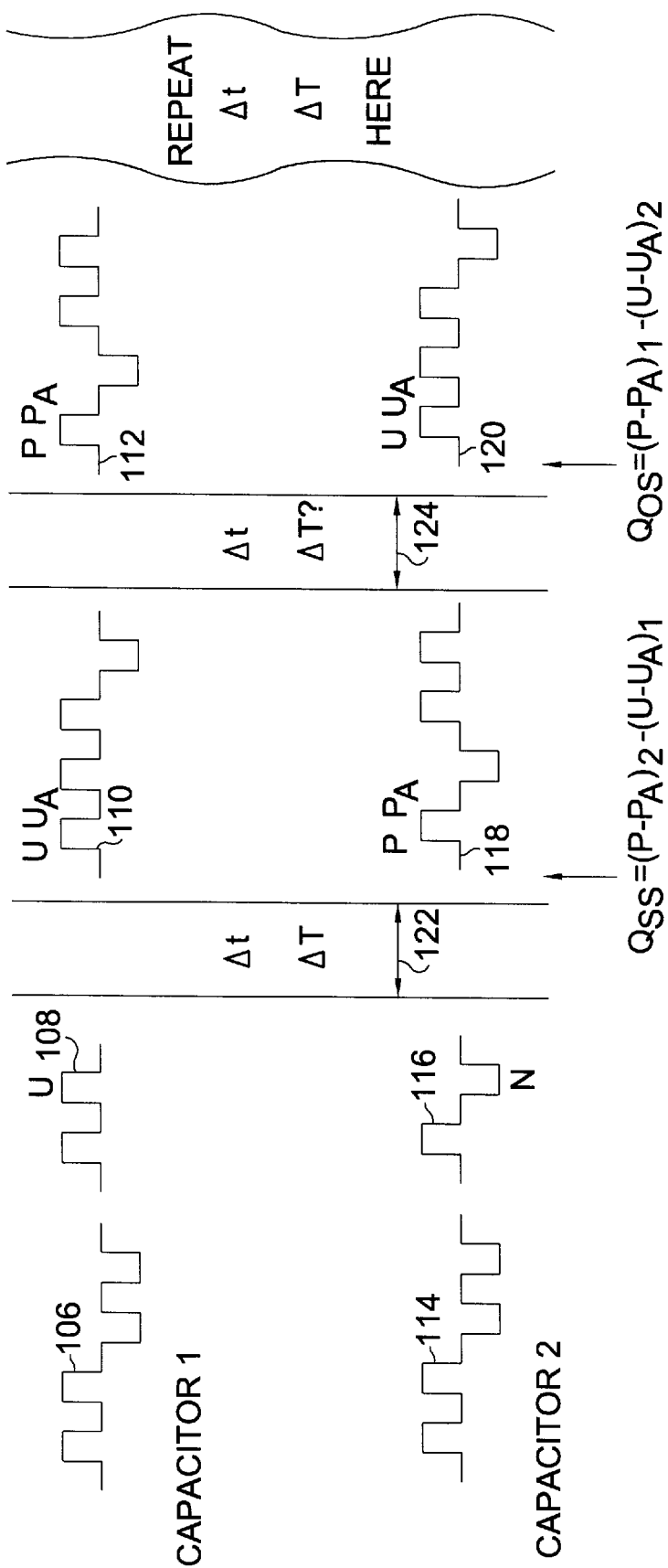
FIG. 6 is a preferred pulse sequence according to the present invention for measuring same state and opposite state retention performance over time.

Referring now to FIG. 6, a pulse sequence is shown, again for testing two ferroelectric capacitors, such as capacitors 76 and 78 shown in FIG. 5. The pulse sequencing shown in FIG. 6 is modeled after the pulse sequence experienced by a memory device with a destructive read operation, such as the 2T-2C memory cell 142 shown in FIG. 7. A 2T-2C ferroelectric memory cell 142 typically includes first and second ferroelectric capacitors 126 and 128 coupled to an active plate line 136, labeled "PL", first and second MOS transistors 130 and 132 coupled to ferroelectric capacitors 126 and 128, and whose gates are coupled to a word line 134, labeled "WL". The drain/source nodes 138 and 140 of MOS transistors 130 and 132 form the complementary bit lines labeled "BL" and "/BL". In a destructive read memory device, such as 2T-2C memory cell 142, the plate line pulsing is always performed in pairs. The first plate line pulse in the pair is a destructive read pulse, and the second pulse in the pair is used to restore the original data state. Note that a 1T-1C cell simply consists of a single transistor 130 and capacitor 126. The word line and plate lines are as shown in FIG. 7, and the single bit line is coupled to an input of a sense amplifier (sense amplifier is not shown in FIG. 7). The other input of the sense amplifier receives a reference voltage so that a valid data state can be generated on the bit line.

The test sequence of FIG. 6 begins with a four-pulse PUND waveform used to initialize ferroelectric capacitors 76 and 78. Waveform 106 is applied to capacitor 76 and waveform 114 is applied to capacitor 78. After the initialization, each ferroelectric capacitor will have a similar initial condition, i.e. the same valid polarization or data. The intialization step can be eliminated, if desired, but it is not recommended. After the respective PUND waveforms have been applied in the initialization step, the capacitors are written to an original complementary data state. Capacitor 76 is written to a data state having an "up polarization" and capacitor 78 is written to a data state having a "down polarization", as shown and described with reference to data state (I) in FIG. 5. Once the original complementary data state (I) has been written, capacitors 76 and 78 are subjected to time and temperature stress for a time interval 122 as described above. The time and temperature stress accelerates the imprint mechanism. After time interval 122 has lapsed, both capacitors 76 and 78 receive a read/restore pulse sequence followed by a read/write pulse sequence. In FIG. 6, these pulse sequences are shown in waveforms 110 and 118, respectively. The read/restore pulse sequence reads the original complementary data state (I) to provide same state retention performance information ($Q_{SS}$ charge level) and the read/write pulse sequence is used to write an opposite complementary data state (II). After a short time delay 124, preferably thirty seconds, capacitors 76 and 78 receive a read/restore pulse sequence to gather the opposite state retention performance information ($Q_{OS}$ charge level) and a read/write pulse sequence to write a new complementary data state (III), which restores the original complementary data state (I). Waveforms 112 and 120 are applied to capacitors 76 and capacitor 78, respectively, to accomplish the read/restore and read/write functions described immediately above.

The "same state" retention charge information ($Q_{SS}$) for two ferroelectric capacitors is obtained according to the following formulae (Equations 1 and 2) in which the terms are derived from the individual charge components of waveforms 110 and 118 shown in FIG. 6 (subscript 1 refers to capacitor 76 and subscript 2 refers to capacitor 78):

$$Q_{SS}=(P-P_A)_2-(U-U_A)_1. \qquad [1]$$

Equation [1] pertains to an "up-down" sensing method in which the plate line is pulsed up and back down to create charge on the bit line, immediately after which the sense amplifier is enabled.

$$Q_{SS}=(P)_2-(U)_1. \qquad [2]$$

Equation [2] pertains to an "up-only" sensing method in which the plate line is pulsed up only to create charge on the bit line, immediately after which the sense amplifier is enabled.

The "opposite state" imprint degradation charge information ($Q_{OS}$) for two ferroelectric capacitors is obtained according to the following formulae (Equations 3 and 4) in which the terms are derived from the individual charge components of waveforms 112 and 120 shown in 6 (subscript 1 again refers to capacitor 76 and subscript 2 again refers to capacitor 78):

$$Q_{OS}=(P-P_A)_1-(U-U_A)_2. \qquad [3]$$

Equation [3] pertains to an "up-down" sensing method in which the plate line is pulsed up and back down to create charge on the bit line, immediately after which the sense amplifier is enabled.

$$Q_{OS}=(P)_1-(U)_2. \qquad [4]$$

Equation [4] pertains to an "up-only" sensing method in which the plate line is pulsed up only to create charge on the bit line, immediately after which the sense amplifier is enabled.

Thus, Equations [1] through [4] allow those skilled in the art to characterize all aspects of retention, including the same state and opposite state retention performance. These equations further allow predictions of long term circuit behavior of a 1T-1C or a 2T-2C memory cell, using either the up-down or the up-only sensing method.

Figure 8:
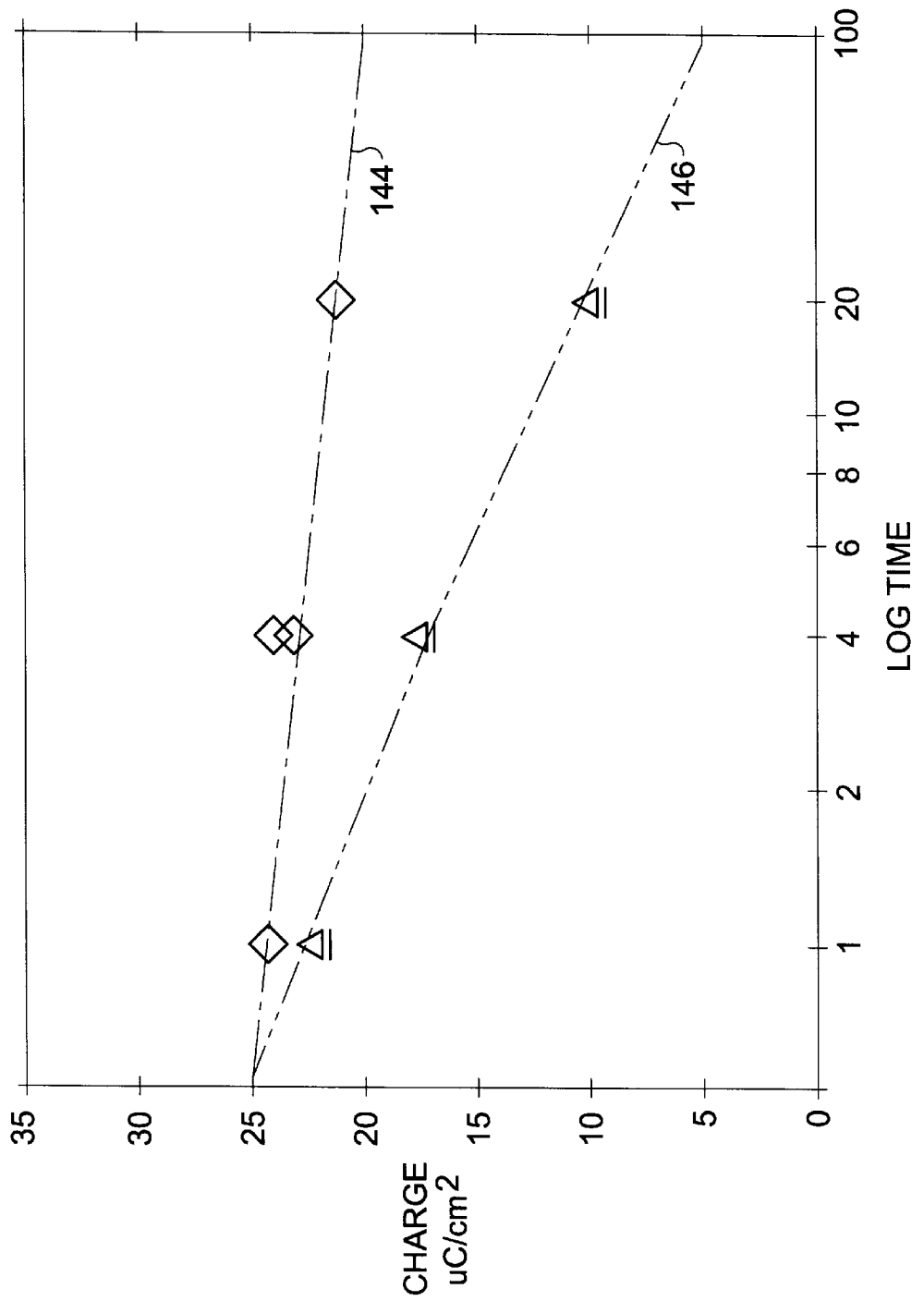
FIG. 8 is a plot of same state retention performance and opposite state imprint performance.

The pulse sequence including interval 122, waveforms 110 and 118, interval 124, and waveforms 112 and 120 are repeated for a plurality of test cycles, at the stress temperature. The same state and opposite state retention information $Q_{SS}$ and $Q_{OS}$ are plotted as a function of log time at stress temperature, which provides a linear fit. Such a plot is shown in FIG. 8. The same state retention charge fitted curve 144 and opposite state charge fitted curve 146 are shown. From the fitted curves, projections can be made as to the long term performance of the ferroelectric capacitors as to same state retention performance ($Q_{SS}$) and opposite state retention performance ($Q_{OS}$) as a function of time in order to fully characterize the ferroelectric capacitors.

Figure 9:
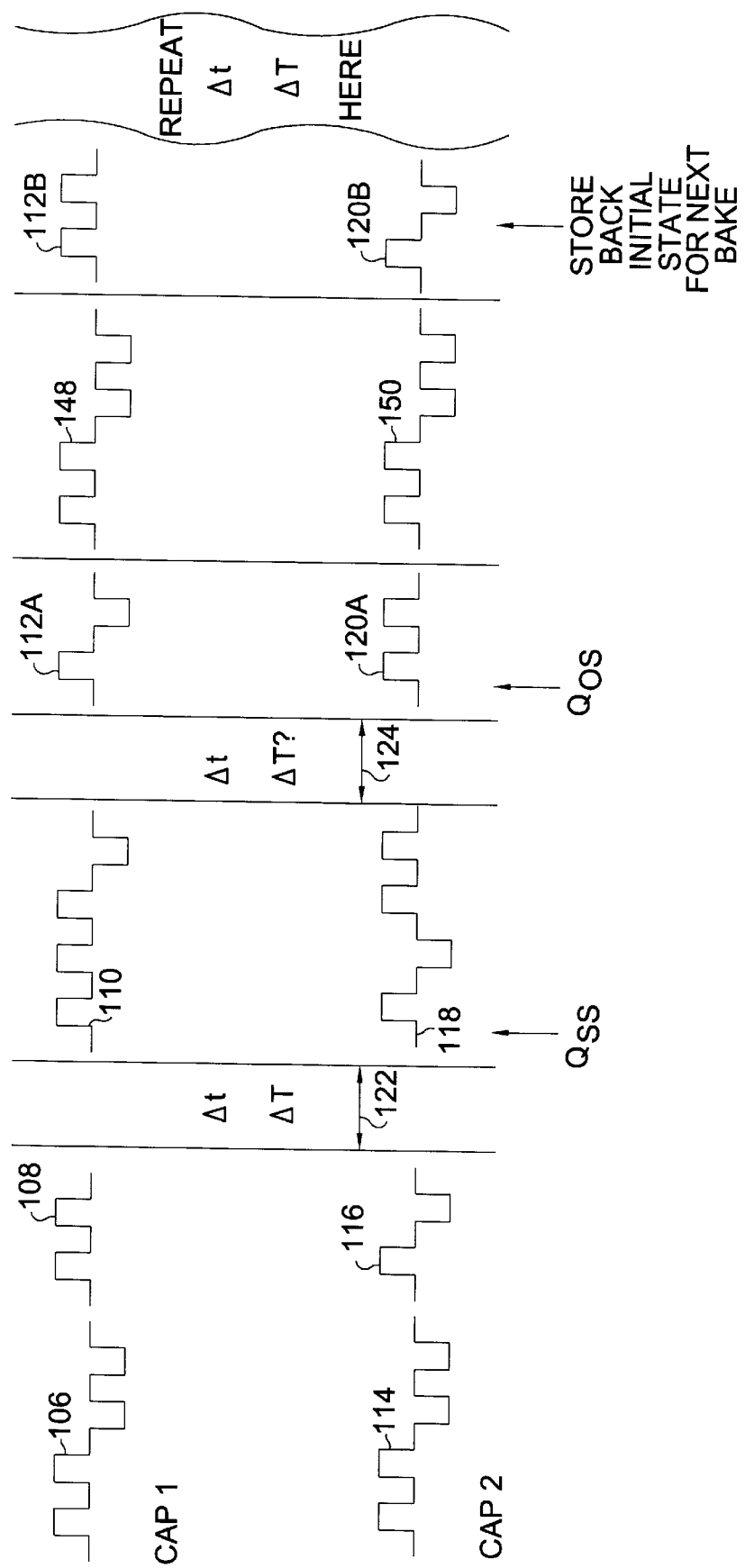
FIG. 9 is a pulse sequence according to the present invention for measuring same state and opposite state retention performance over time, as well as an indication of loop shift or asymmetry.

Referring now to FIG. 9, an additional PUND waveform may be inserted into the pulse sequence to gain additional information related to hysteresis loop shift or asymmetry, if this information is desired. The pulse sequences shown in FIG. 9 are essentially the same as those shown in FIG. 6, except that the four-pulse waveforms 112 and 120 are "split" in half, and the PUND waveforms 148 and 150 are inserted. The additional PUND waveforms enable the average "switched charge" to be measured according to the formula:

$$Q_{SW}=((N-D)+(P-U))/2 \qquad [5]$$

Equation [5] is applied to both capacitors 76 and 78 and can be helpful in further characterizing ferroelectric capacitors for total switched charge, which is an indicia of hysteresis loop shift or asymmetry.

Figure 10B:
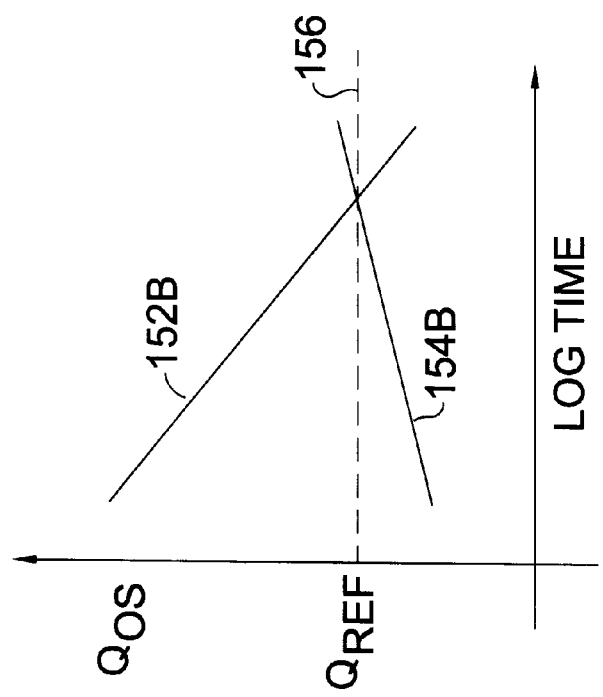
FIG. 10B is a plot showing the opposite state $Q_{OS}$ charge components useful for setting the reference charge level for a 1T-1C ferroelectric memory cell.
Figure 10A:
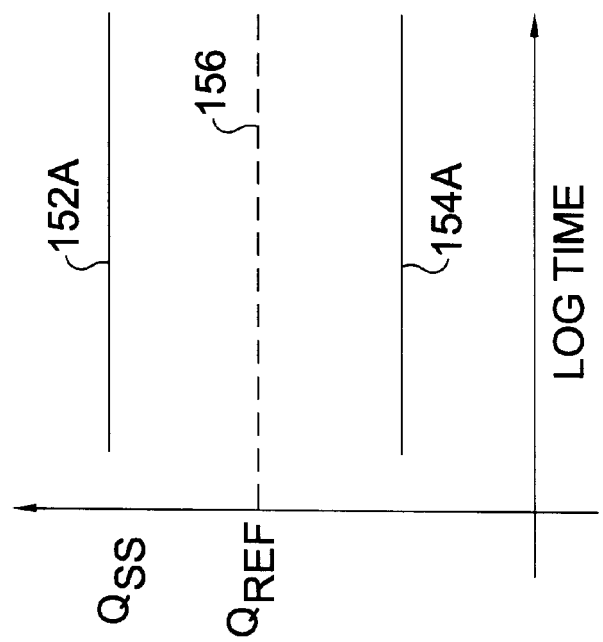
FIG. 10A is a plot showing the same state $Q_{SS}$ charge components useful for setting the reference charge level for a 1T-1C ferroelectric memory cell.

Referring now to FIGS. 10A and 10B, the manner of characterizing the reference charge level, $Q_{REF}$, of a 1T-1C ferroelectric memory is set forth in detail. In FIG. 10A, for the case of up-down sensing, the same state switched charge component 152A corresponds to $(P-P_A)_2$ in Equation [1] and the same state non-switched charge component 154A corresponds to $(U-U_A)_1$ in Equation [1]. In FIG. 10B, for the case of up-down sensing, the opposite state switched charge component 152B corresponds to $(P-P_A)_1$ in Equation [3] and the opposite state non-switched charge component 154B corresponds to $(U-U_A)_2$ in Equation [3].

Equivalently, for the case of the up-only sensing method, the same state switched charge component 152A corresponds to $(P)_2$ in Equation [2] and the same state non-switched charge component 154A corresponds to $(U)_1$ in Equation [2]. In FIG. 10B, for the case of up-only sensing, the opposite state switched charge component 152B corresponds to $(P)_1$ in Equation [4] and the opposite state non-switched charge component 154B corresponds to $(U)_2$ in Equation [4].

A reference charge $Q_{REF}$ is nominally set approximately halfway between the same state switched charge component 152A and the same state non-switched component 154A in FIG. 10A. The reference charge $Q_{REF}$, however, must be further characterized by analyzing the opposite state switched charge component 152B and the opposite state non-switched charge component 154B shown in FIG. 10B, which decrease and increase with time, respectively. The $Q_{REF}$ charge level is set so that it is approximately equal to the "end of life" charge at point 157, which is the intersection of charge curves 152B and 154B. Note that this level selected may not be identical to the halfway point set nominally for the same state case shown in FIG. 10A, but will provide the longest retention performance for a 1T-1C memory cell over time.

While I have described the test method of the present invention in detail, still further detailed description is set forth in the attached Appendix, which forms a part of the written description of this invention.

Having described and illustrated the principles of the invention in a preferred embodiment thereof, it is appreciated by those having skill in the art that the invention can be modified in arrangement and detail without departing from such principles. For example, the exact timing and voltage of the various testing waveforms can be changed as required by the ferroelectric material or capacitor under test, or as desired for other reasons. Either discrete or integrated capacitors can be tested. The test methods taught herein can be easily applied for other purposes such as computer modeling of ferroelectric devices. I therefore claim all modifications and variation coming within the spirit and scope of the following claims.

I claim:

1. A method for measuring retention performance in ferroelectric capacitors, the method comprising the steps of:
   (a) collecting same state charge values from a pair of ferroelectric capacitors formed of a first ferroelectric capacitor and a second ferroelectric capacitor;
   (b) collecting opposite state charge values from respective ones of the first and second ferroelectric capacitors, respectively, of the pair of ferroelectric capacitors;
   (c) subjecting both the first and second of the pair of ferroelectric capacitors to time and temperature stress; and
   (d) plotting the same state charge and opposite state charge values versus time.

2. A method for characterizing retention in ferroelectric capacitors, the method comprising the steps of:
   (a) writing an original complementary data state into a pair of ferroelectric capacitors formed of a first ferroelectric capacitor and a second ferroelectric capacitor;
   (b) subjecting the first and second ferroelectric capacitors, respectively, to time and temperature stress;
   (c) reading the original complementary data state from the pair of ferroelectric capacitors and recording the same state charge value;
   (d) writing an opposite complementary data state into the pair of ferroelectric capacitors;
   (e) waiting for a predetermined time interval;
   (f) reading the opposite complementary data state from the pair of ferroelectric capacitors and recording the opposite state charge value;
   (g) writing the original complementary data state into the pair of ferroelectric capacitors; and
   (h) repeating steps (b) through (g) for a plurality of cycles to gather same state and opposite state charges values as a function of time and temperature.

3. The method of claim 1 further comprising the step of initializing the pair of capacitors to a valid data state.

4. A method for characterizing retention in ferroelectric capacitors, the method comprising the steps of:
   (a) reading/writing an original complementary data state into a pair of ferroelectric capacitors formed of a first ferroelectric capacitor and a second ferroelectric capacitor;
   (b) subjecting the first and second ferroelectric capacitors, respectively, to time and temperature stress;
   (c) reading/restoring the original complementary data state from the pair of ferroelectric capacitors and recording the same state charge value;
   (d) reading/writing an opposite complementary data state into the pair or ferroelectric capacitors;
   (e) waiting for a predetermined time interval;
   (f) reading/restoring the opposite complementary data state from the pair of ferroelectric capacitors and recording the opposite state charge value;
   (g) reading/writing the original complementary data state into the pair of ferroelectric capacitors; and
   (h) repeating steps (b) through (g) for a plurality of cycles to gather same state and opposite state charges as a function of time and temperature.

5. The method of claim 4 further comprising the step of initializing the pair of ferroelectric capacitors to a valid data state.

6. The method of claim 5 in which the initializing step comprises the step of applying a PUND pulse sequence to each of the first and second ferroelectric capacitors in the pair.

7. The method of claim 4 in which step (a) comprises the steps of applying a PU pulse sequence to the first ferroelectric capacitor in the pair and applying a PN pulse sequence to the second ferroelectric capacitor in the pair.

8. The method of claim 4 in which step (b) lasts for about an hour at a temperature of about 150° C.

9. The method of claim 4 in which step (c) comprises the steps of applying a UU pulse sequence to the first ferroelectric capacitor in the pair and applying a PN pulse sequence to the second ferroelectric capacitor in the pair.

10. The method of claim 4 in which step (d) comprises the steps of applying a UN pulse sequence to the first ferroelectric capacitor in the pair and applying a PU pulse sequence to the second ferroelectric capacitor in the pair.

11. The method of claim 4 in which step (e) lasts for about thirty seconds.

12. The method of claim 4 in which step (e) lasts for about five minutes.

13. The method of claim 4 further comprising the step of applying an elevated temperature to the ferroelectric capacitors during step (e).

14. The method of claim 4 in which step (f) comprises the steps of applying a PN pulse sequence to the first ferroelectric capacitor in the pair and applying a UU pulse sequence to the second ferroelectric capacitor in the pair.

15. The method of claim 4 in which step (g) comprises the steps of applying a PU pulse sequence to the first ferroelectric capacitor in the pair and applying a PN pulse sequence to the second ferroelectric capacitor in the pair.

16. The method of claim 4 further comprising the step of applying a PUND pulse sequence to both of the ferroelectric capacitors in the pair between steps (f) and (g).

17. A method for characterizing the reference charge level for a 1T-1C ferroelectric memory cell, the method comprising the steps of:
   (a) collecting opposite state switched charge information over time and temperature form a pair of ferroelectric capacitors formed of a first ferroelectric capacitor and a second ferroelectric capacitor;
   (b) collecting opposite state non-switched charge information over time and temperature from the pair of ferroelectric capacitors;
   (c) determining an "end of life" charge level from the opposite state switched and non-switched charge information; and
   (d) setting the reference charge level approximately equal to the "end of life" charge level.

18. The method of claim 17 in which the charge information in steps (a) and (b) is generated according to the "up-down" sensing method.

19. The method of claim 17 in which the charge information in steps (a) and (b) is generated according to the "up-only" sensing method.

20. A method for measuring retention performance in ferroelectric capacitors comprising the steps of collecting a plurality of same state and opposite state charge values from a pair of ferroelectric capacitors formed of a first ferroelectric capacitor and a second ferroelectric capacitor during time and temperature stress.

* * * * *